US007292160B1

(12) United States Patent
Wang

(10) Patent No.: US 7,292,160 B1
(45) Date of Patent: Nov. 6, 2007

(54) CONTEXT SENSITIVE ENCODING AND DECODING

(75) Inventor: Kuansan Wang, Bellevue, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 11/438,207

(22) Filed: May 22, 2006

Related U.S. Application Data

(60) Provisional application No. 60/793,174, filed on Apr. 19, 2006.

(51) Int. Cl.
*H03M 7/34* (2006.01)

(52) U.S. Cl. .......................................... 341/51; 341/55

(58) Field of Classification Search .................. 341/51, 341/55; 715/513
See application file for complete search history.

(56) References Cited

U.S. PATENT DOCUMENTS 6,519,617 B1 2/2003 Wanderski et al.
6,671,853 B1 12/2003 Burkett et al.
6,718,516 B1 4/2004 Claussen et al.
6,847,999 B1 1/2005 Dodrill et al.
6,931,532 B1 8/2005 Davis et al.
7,143,344 B2 * 11/2006 Parker et al. ............... 715/513
7,172,122 B2 * 2/2007 Alleshouse ............ 235/462.01
2001/0044811 A1 11/2001 Ballantyne et al.
2004/0060007 A1 3/2004 Gottlob et al.
2005/0177543 A1 8/2005 Chen et al.
2005/0177578 A1 8/2005 Chen et al.
2005/0234727 A1 10/2005 Chiu
2006/0015489 A1 * 1/2006 Probst et al. .................. 707/3

OTHER PUBLICATIONS

Marc Girardot, Neel Sundaresan, "Millau: An Encoding Format for Efficient Representation and Exchange of XMLover the Web", Millau: A Binary Encoding Format for XML Documents, http://www9.org/w9cdrom/154/154.html.

Wang et al., "XCpaqs: Compression of XML Document with XPath Query Support", IEEE, 2004. http://ieeexplore.ieee.org/search/srchabstract.jsp?amumber=1286479&isnumber=28682&punumber=9035&k2dockey=1286479@ieeecnfs&query=%28+%28+context%3Cin%3Emetadata+%29+%3Cand%3E+%28+encoding%3Cin%3Emetadata+%29+%29%3Cand%3E+%28+xml%3Cin%3Eab+%29&pos=0.

Ide et al., "XCES: An XML-Based Encoding Standard for Linguistic Corpora", http://www.cs.vassar.edu/~ide/papers/xces-Irec00.pdf.

* cited by examiner

*Primary Examiner*—Brian Young
(74) *Attorney, Agent, or Firm*—Vierra Magen Marcus & DeNiro LLP

(57) ABSTRACT

A computer implemented method of encoding and decoding a data file. The method of encoding includes assigning a context to the data file; and encoding the data file using an encoding method associated with the context. The method of decoding includes reading a context assigned to a data file; and decoding the data file using a decoding method associated with the context. More efficient use of limited encoding representations result.

16 Claims, 4 Drawing Sheets

CONTEXT SENSITIVE ENCODING AND DECODING

PRIORITY DATA

The present application claims priority to U.S. Provisional Patent Application No. 60/793,174, filed Apr. 19, 2006, entitled "CONTEXT SENSITIVE ENCODING AND DECODING."

BACKGROUND

Modern communication systems provide increasing flexibility in how users can route information to themselves. Communications systems now integrate voice, messaging and data interfaces into common clients, such as MSN messenger or Yahoo messenger.

Computer Telephony Integration (CTI) is technology that allows interactions on a telephone and a computer to be integrated or coordinated. As contact channels have expanded from voice to include email, web, and fax, the definition of CTI has expanded to include the integration of all customer contact channels (voice, email, web, fax, etc.) with computer systems.

Some common functions of computer telephony integration include calling line information display, screen population on answer, on screen dialing and on screen phone control (ringing, answer, hang-up, hold, conference etc). Internet Protocol based communication systems, including PBX devices, allow users to transfer incoming telephone calls to alternative communication clients, such as instant messaging systems.

In order to configure such devices, configuration files are passed between a communication client and the communication system. For example, in a PBX device, a user may wish to be notified of incoming calls at an instant messing client while the user is in a meeting, away from his office. In order to inform the PBX that the user wishes to transfer the incoming calls, a configuration interface generates a configuration file and exports the file to the PBX.

The European Computer Manufacturers Association (ECMA) is a non-profit international industry association which establishes standards for information and communication systems. One standard, ECMA-323, specifies an XML protocol Computer Supported Telecommunications Applications (CSTA). Computers can control and monitor telephone switches by sending and receiving XML through TCP/IP protocol. XML has become a popular means to encode requests and responses for client server applications based on service oriented architecture (SOA). The XML configuration file is but one example of a configuration file which may be transmitted between respective service devices.

In communications systems serving a large number of clients, the bandwidth consumed by these configuration files becomes an important consideration. As the number of users and the functionality provided by such systems increase, the increasing bandwidth occupied by these configuration files will become a performance drag on the communication system. In the above example of computer integrated telephony, files that are transmitted between respective systems need to be lossless so that particular commands which are transmitted back and forth and in particular the XML schemas, are maintained. In these cases, the decompressed file and the original file are identical. Lossless compression is used when it is important that the original and decompressed file be essentially identical. Compression of XML files in this manner has been proposed to the ECMA Standards Based Organization in the utilization of ECMA standard 323.

SUMMARY

Technology for encoding and decoding information based on its context is presented. Files are encoded by assigning a context to the data file; and encoding the data file using an encoding method associated with the context. Files can then be decoded by reading a context assigned to a data file; and decoding the data file using a decoding method associated with the context. Optionally, the data files are XML files and the contexts are XSLT files.

In another aspect, a computer implemented method of communicating data between a first computer and a second computer is provided. The method includes encoding a data file with a context-sensitive encoding technique; transferring the data between the first computer and the second computer; and decoding the data file with a context sensitive decoding technique. The method finds particular applications where each data file is an XML file including CSTA instructions.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DETAILED DESCRIPTION

Technology is disclosed for efficiently encoding and decoding information based on a context associated with the information. This allows communicating the information between two devices more efficient. Encoding and decoding of information occurs using different schemes based on the context, allowing for representations of the data to be repeated for different contexts, thereby making limited representations of long data strings available in multiple contexts.

In one example, the technology implements context sensitive encoding of XML based instructions for a computer integrated telephony applications. Context sensitive encoding and decoding uses the natural segmentation of many XML schemas to further reduce the complexity of an XML document. Because XML is a text based standard, the tags in the XML document are often chosen to be human readable so as to simplify the debugging processes. As a result, XML exchanged between the computers can be more verbose than binary data. The encoding and decoding technology optimizes the exchange of XML documents by allowing the documents to be shortened to smaller, encoded tags which can be expanded at the receiving computer, based on an embedded context identifier in the file.

Figure 1:
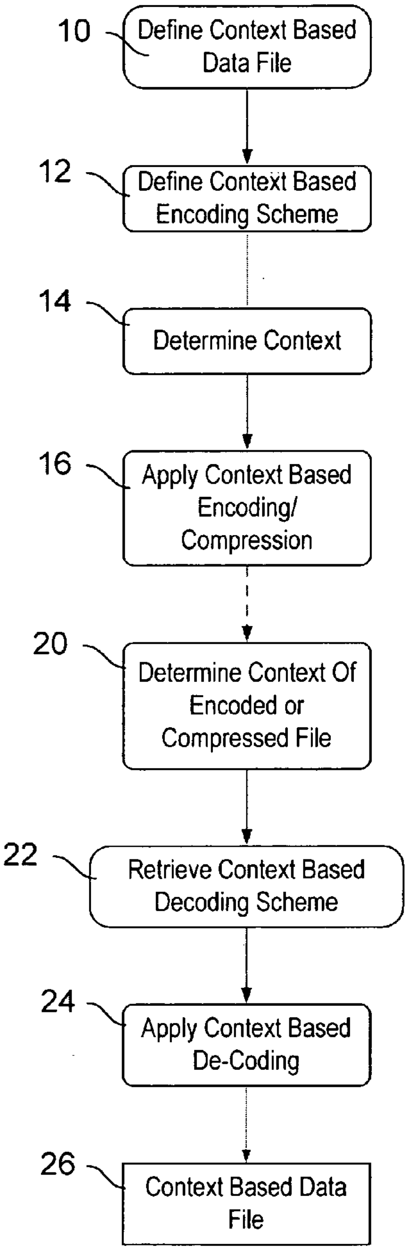
FIG. 1 depicts a first method of communicating instructions between two devices in accordance with the technology discussed herein.

FIG. 1 is a depiction of a method for implementing the technology discussed herein. At step 10, a data file is defined to include data and a context definition. The data file may be any text or binary file which would benefit from encoding or compression, and for which context identification can be determined both before and after encoding. In accordance with the method, any number of different data files, each having a different context, may be identified. As discussed below, the context of the data file used with a context specific encoding or decoding scheme to encode or decode the data. The technology is particularly useful when using lossless encoding and decoding.

At step 12, a context based encoding scheme is defined. In one embodiment, a context based encoding scheme may be associated with each data file, and hence each data file has its own context. In another embodiment, groups of files are associated in a common context. At step 14, the context is determined for the particular data file at step 10, and at step 16, a context based encoding or compression scheme is applied to the data file.

The context based encoding scheme allows common coded representations of data elements to be utilized more than once. In a very basic example, assume the word “aardvark” is present in a first data file having a first context and the word “artistic” is present in the second data file having a second context. Assume further that an encoding scheme reduces the term aardvark to the representation “AA”. By applying a context to the first data file containing the word aardvark, and defining a second context for the data file containing the word artistic, a second encoded second file may also use the term “AA” to represent the word artistic. Hence, two encoded data files having different contexts may have the same representation of data elements. Upon decoding, by determining the context of the respective data files, a decoder will be able to understand which of the two terms the representation “AA” is meant to refer.

As shown in FIG. 1, once a context based data file has been compressed at step 16, at some later step (as represented by the dashed line between step 16 and step 20), a decoder can determine the context of the encoded or compressed file at step 20, and at step 22 retrieve a context based decoding scheme. At step 24 the context based decoding scheme is applied to the data file to decode the file and the result is semantically equivalent data file 26.

In the above example of computer integrated telephony, files that are transmitted between respective systems need to be lossless so that particular commands which are transmitted back and forth and in particular the XML schemas, are maintained. In these cases, the decompressed file and the original file are semantically identical.

As will be generally understood, by encoding data files using the context sensitive technology discussed herein between a communications agent and a communications server, much more information can be provided between the two systems without the loss of information and without paying bandwidth penalties for transmitting such information.

Figure 2:
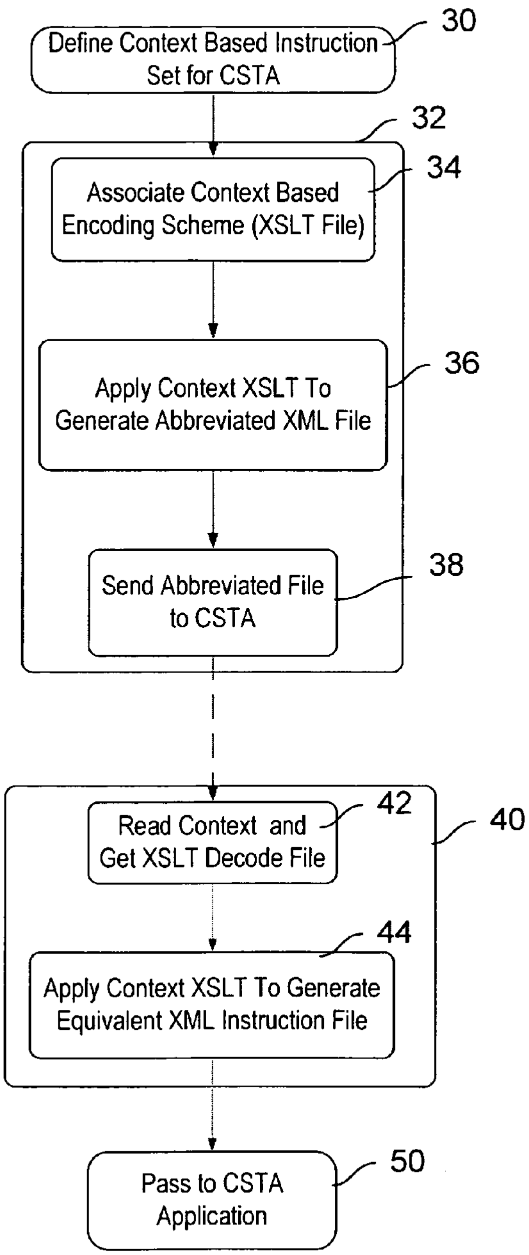
FIG. 2 is a more detailed method of communicating instructions between two devices.

FIG. 2 is a more detailed flowchart illustrating how the method of FIG. 1 is utilized in the context of CSTA call control events in conjunction with the ECMA 323 standard. As noted above, one way to optimize CSTA XML messages while maintaining the structure of ECMA 323 is to provide an option that substitutes the existing ECMA 323 XML tags with shorter tags. Short tags can be used for names of services, events, and parameters. Short tags can be one to two characters for the most commonly used tags.

By modifying this option to allow for context based encoded instruction sets, these representations can be re-used across different encoded files.

Figure 3:
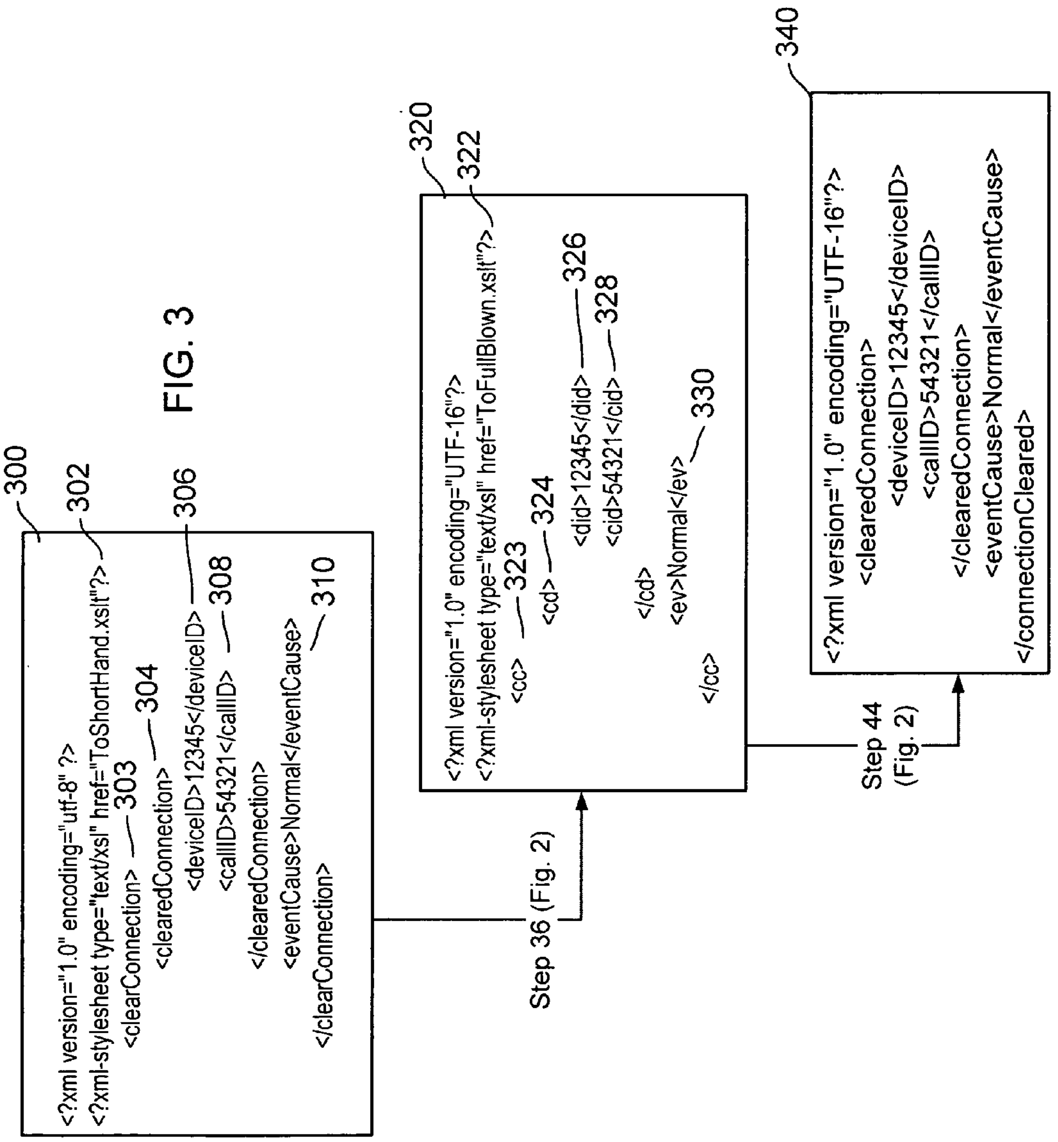
FIG. 3 is a depiction of the transformation of an instruction file for a communication device in XML format.

In FIG. 2, at step 30, a context based instruction set for a CSTA application is defined at step 30. The instruction set may include a context based identifier. In one embodiment, where the ECMA 323 standard is utilized, a representative instruction set file is shown in FIG. 3 at box 300.

As shown therein, the context based identifier may be a reference to a style sheet at 302. XSLT is a “style sheet” standard in the XML family that serves as a programming language to convert one XML document into another. XSLT is designed to be a tool that can transform a verbose XML document into a shorter albeit less human readable form. In one case, Huffman code can be utilized as a solution for designing the XSLT to generate the minimum length results. Typically, a single XSLT style sheet will be developed to transform one schema type of XML documents into another schema. XSLT can act as a bi-directional translator for XML. An XSLT style sheet often contains rules to process all the schema elements in the source and target XML documents. As the schema gets complicated, so does the XSLT style sheet used to translate the document.

A CSTA XML document 300 may include a function 303 of clearing a connection (clearConnection). The definition includes a device I.D. 306 and a call I.D. 308. The file 300 may also include an event cause (indicating why the event occurred) 310 shown therein as being a “normal” event cause.

Returning to FIG. 3, the encoding sequence 32 begins at step 34 where the context of the file or instruction set defined at step 30 is determined. In step 34, when using an XML based style sheet, this includes reading the XSLT file definition in the file. At step 36, the associated context based encoding scheme, in this case XSLT file, is associated with the instruction set defined at step 30, and applied to the instruction set to generate an abbreviated XML file.

An example of an XSLT file that can be used to encode an instruction file is as follows:

```
<xsl:stylesheet version=“1.0” xmlns:xsl=“http://www.w3.org/1999/XSL/Transform”>
  <xsl:template match=“/”>
  <xsl:apply-templates/>
  </xsl:template>
  <xsl:template match=“clearConnection”>
  <xsl:element name=“cc”>
    <xsl:apply-templates/>
  </xsl:element>
  </xsl:template>
  <xsl:template match=“deviceID”>
  <xsl:element name=“did”>
    <xsl:value-of select=“.”/>
  </xsl:element>
  </xsl:template>
  <xsl:template match=“callID”>
  <xsl:element name=“cid”>
    <xsl:value-of select=“.”/>
  </xsl:element>
  </xsl:template>
  <xsl:template match=“eventCause”>
  <xsl:element name=“ev”>
    <xsl:value-of select=“.”/>
  </xsl:element>
  </xsl:template>
</xsl:stylesheet>
```

As noted from a review of the code, representative functions (ClearConnection; DeviceID, etc.) are associated with different encoded values ("cc", "did"). For a different XSLT file, the encoded values may represent different functions. Were all the possible commands and codes placed in a single XSLT file, the encoded values would be longer, since repetition of the codes in the encoded file could not be allowed. However, by segmenting the codes into different contexts (for example, call commands, messaging commands, etc.), shorter codes result. Mathematically, the so-called Huffman code can be shown to be the optimal solution for designing the XSLT to generate the minimum length results. Huffman coding is an entropy encoding algorithm used for lossless data compression. In Huffman coding, a variable-length code table is used for encoding a source symbol (such as a character in a file). The table elements are derived based on the estimated probability of occurrence for each possible value of the encoded element. However, the particular encoding scheme embodied in the XSLT file is not limited to any particular solution.

At step 38, the abbreviated XML file can be sent to the system requiring the file for consumption.

A representation of an abbreviated XML file is shown at box 320 in FIG. 3. As shown therein, the encoded file includes it's own context definition 322, which in this case is again an XSLT definition. The clear connection command has been reduced to the term "CC" 323, the cleared connection command to the term "CD" 324, the device I.D. reduced to the term "DID" 326, the caller I.D. reduced to the term "CID" 328 and the event cause to the term "EV" 330. Note that in this example the values have not been reduced but in an alternative embodiment the values may be reduced as well.

The decoding sequence is generally represented by a sequence of steps surrounded by box 40. At step 42, the context of the encoded file is determined. In this example, this can be determined from, for example, the XSLT style definition which remains in the abbreviated file as illustrated in box 320 and FIG. 3. At step 44, a context based decoding scheme, in this case the context based XSLT file "to full blown XSLT" is utilized to generate a semantically equivalent XML instruction (box 340 in FIG. 3). In this case, the XSLT file "toFullBlown.xslt" is utilized to decode the file and an example of this XSLT file may be as follows:

```
<?xml version="1.0" encoding="UTF-8" ?>
<xsl:stylesheet version="1.0" xmlns:xsl="http://www.w3.org/1999/XSL/Transform">
  <xsl:template match="/">
  <xsl:apply-templates/>
  </xsl:template>
  <xsl:template match="cc">
  <xsl:element name="connectionCleared"
    namespace="http://www.ecma-international.org/standards/ecma323/ed3">
    <xsl:apply-templates/>
  </xsl:element>
  </xsl:template>
  <xsl:template match="cd">
  <xsl:element name="clearedConnection"
    namespace="http://www.ecma-international.org/standards/ecma323/ed3">
  <xsl:apply-templates/>
  </xsl:element>
  </xsl:template>
  <xsl:template match="did">
  <xsl:element name="deviceID" namespace="http://www.ecma-international.org/standards/ecma323/ed3">
  <xsl:value-of select="."/>
  </xsl:element>
  </xsl:template>
  <xsl:template match="cid">
  <xsl:element name="callID" namespace="http://www.ecma-international.org/standards/ecma323/ed3">
  <xsl:value-of select="."/>
  </xsl:element>
  </xsl:template>
  <xsl:template match="ev">
  <xsl:element name="eventCause" namespace="http://www.ecma-international.org/standards/ecma323/ed3">
    <xsl:value-of select="."/>
  </xsl:element>
  </xsl:template>
</xsl:stylesheet>
```

In the above example, a namespace is associated with each element. However, this is not necessarily required for a given XSLT file.

An example of an expanded semantically equivalent instruction set file is shown at box 320 in FIG. 3. As shown therein, the file 320 is semantically equivalent to file 300.

Once the decoded file is created, at step 50, the decoded file may be transmitted to the consuming application.

Figure 4:
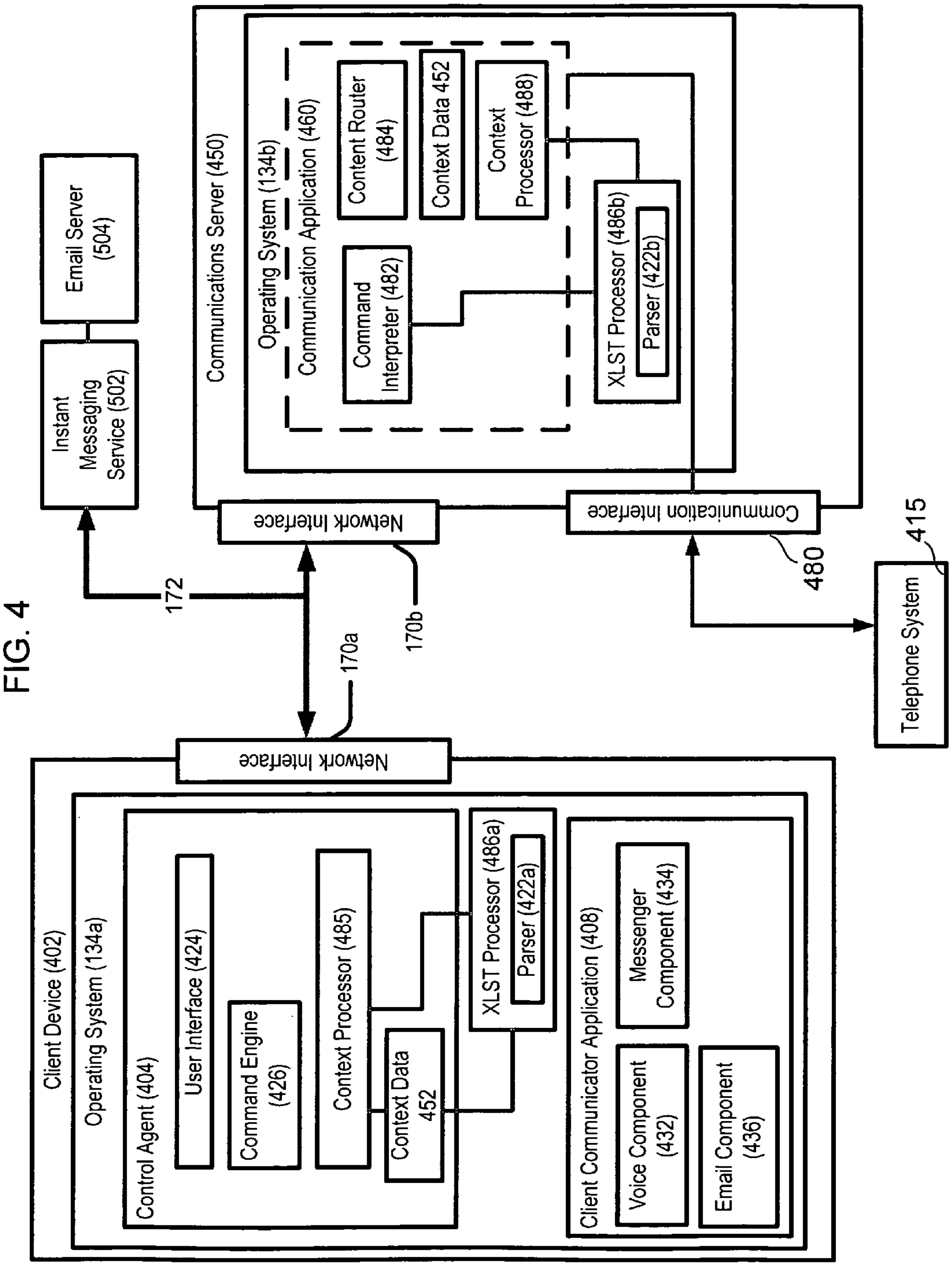
FIG. 4 is a depiction of an exemplary system incorporating the technology discussed herein.

FIG. 4 is an exemplary environment for utilizing the technology discussed herein. Shown in FIG. 4 is a client device 402 and a communications server 450. The client device 402 and communications server 450 may each comprise one or more processing devices such as that illustrated in FIG. 5. Communications server 450 may likewise comprise a dedicate communication server such as a PBX system.

In this example, the client device 402 includes an operating system 134 including its application programs such as control agent 404 and a communications application 408. Communications application 408 may comprise a multi-component communications application which includes, for example, a voice component 432 allowing the user to communicate via voice communications, a messaging component 434 allowing the user to communicate via instant messaging applications, and an e-mail component 436 allowing the user to transmit and receive e-mails via a network interface.

Control agent 404 provides CSTA based instructions to the communications server 450. Control agent 404 includes the user interface 424, a command generation engine 426, and a context processor at 450. The context processor provides the context identifier based on the particular encoding context defined for a file or group of files to be transmitted. In one example, the context processor 450 defines, for each instruction set, an associated XSLT file for use in encoding and decoding the XSLT file. Context data 452 may include, for example, a number of XSLT style sheets for use by the XSLT processor 486*a*.

Also shown in client device 402 is an XSLT processor 486*a* which includes an XSLT parser at 422*a*. Conversion of XML documents is accomplished using the XSLT processor 486*a* which transforms the input based on the XSLT codes in the document. The processor uses the XML parser 422*a* to separate XML elements into a tree structure before manipulating them.

Client device 402 communicates with the communication server 450 via a network connection and network interface 170*a*. The network coupling devices 402 and 410 may be a LAN, WAN, or a combination of local and wide area networks, such as the internet.

Communications server 450 includes an operating system 134*b* and a communications application 452 which may include a command interpreter 482, a content router 484, and a context processor 488. Communications server 450 interacts with various communications services, including, for example, a telephone service 415, a messaging service 502 and an email service 504. Interaction takes place though wither the network interface 170*b* (for messaging, email and voice-over-IP phone services), or a communications interface 435 for non-network enabled applications, such as plain old telephone system (POTS) devices such as a telephone service 415. The command interpreter 482 interprets various forms of communications content from either the communications applications 408, email service 504, messaging service 502 or telephone system 415 and interprets configuration commands for content router 484.

The content router 484 allows the communications application to distribute content between the various applications 408 and services 415 which may be processed by the communications server. For example, a voice component from a messaging application 502 in the communications application 408 may be routed by the content router to a telephone 415. Likewise, a telephone voicemail message from a telephone 415 received by the communications interface 435 may be routed to an e-mail message in service 504 and forwarded via the network interfaces to the e-mail component of the communications application 408.

The communications application 452 includes a context processor 488 which communicates with a XSLT processor 486 on the communications server. The XSLT processor 486 has the same functionality as that on the client device 402. The XSLT processor outputs decoded instruction files received from the client device 402 to the command interpreter 482 providing instructions to the content router 484. The XSLT processor 486 on the communication server 450 can also encode files to be retuned to the client device 402 to, for example, provide instructions to the communications application.

In the context of the method of FIG. 2, when a user provides an instruction via the user interface 424 to, for example, have calls routed from the user's telephone (for example telephone 415) to the user's communications application (for example the user's messenger component 412), the command engine 426 will generate a instruction file which in one embodiment would be an XML instruction file. The context processor 450 will associate a context identifier with the command file and provide the full XML instruction set file to the XSLT processor 486 on a client device 402. The output of the XSLT processor would be an abbreviated XML file which is forwarded via the network interface 170*a* to the network interface 170*b* of the communications server. Upon receipt by the network interface at the communications server 450, the XSLT processor 486*b* will receive the file and utilize a context processor 488, retrieve a decoding XSLT file from the context data 452. The XSLT processor 486*b* will then use this XSLT file to provide a context equivalent XML instruction file for the command interpreter 482. The command can be implemented by the content router 484 or other components of the communications application 452. Likewise, instruction sets can be returned to the client device 402 via the XSLT processor on the communications server to the XSLT processor on the client device 402.

It will be readily recognized that the technology discussed herein is not limited to the aforementioned use in computer integrated telephony or CSTA applications. Any encoding which is designed to provide lossless encoding over a series of data files would benefit by dividing those files into context based segments and encoding or decoding those segments based on the encoding scheme. Another exemplary use of the present technology would be to provide instruction set files based on web services between web services applications. In such context, a SOAP (simple object access protocol) interface can be utilized in conjunction with the XSLT processor to distribute instruction set files between various client and server embodiments. It will be further understood that the level of segmentation may vary in accordance with the application. Segmentation may be done on a per file basis. In another embodiment, context segmentation into two contexts for any number of files may be provided.

The present invention is not limited to XML files or even text based decoding schemes. Additional examples where the application of context is sensitive in coding and decoding may be useful is in the context of any compression scheme, including multimedia compression schemes of audio, video, images, or any other data.

Figure 5:
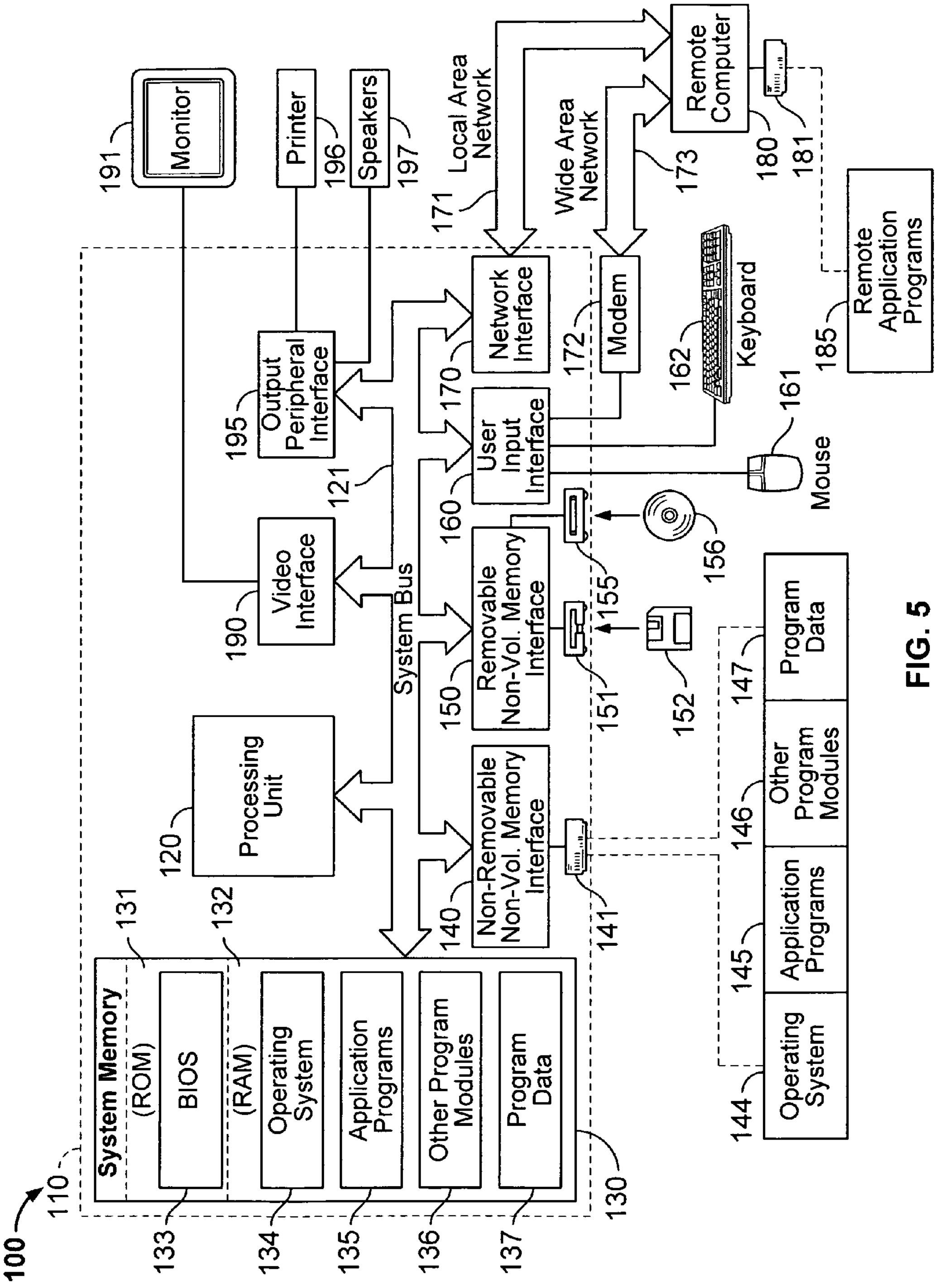
FIG. 5 is a depiction of an exemplary processing device.

FIG. 5 illustrates an exemplary processing device suitable for the client device 402 or communication server 450 of FIG. 4. FIG. 5 illustrates an example of a suitable computing system environment 100 on which the invention may be implemented. The computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 100.

The invention is operational with numerous other general purpose or special purpose computing system environments or configurations. Examples of well known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The invention may be described in the general context of computer-executable instructions, such as program modules, being executed by a computer. Generally, program modules include routines, programs, objects, components, data structures, etc. that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

With reference to FIG. 5, an exemplary system for implementing the invention includes a general purpose computing device in the form of a computer 110. Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 110 typically includes a variety of computer readable media. Computer readable media can be any available media that can be accessed by computer 110 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer 110. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 1 illustrates operating system 134, application programs 135, other program modules 136, and program data 137.

The computer 110 may also include other removable/non-removable, volatile/nonvolatile computer storage media. By way of example only, FIG. 5 illustrates a hard disk drive 140 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 141 is typically connected to the system bus 121 through an non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 5, provide storage of computer readable instructions, data structures, program modules and other data for the computer 110. In FIG. 5, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies. A user may enter commands and information into the computer 20 through input devices such as a keyboard 162 and pointing device 161, commonly referred to as a mouse, trackball or touch pad. Other input devices (not shown) may include a microphone, joystick, game pad, satellite dish, scanner, or the like. These and other input devices are often connected to the processing unit 120 through a user input interface 160 that is coupled to the system bus, but may be connected by other interface and bus structures, such as a parallel port, game port or a universal serial bus (USB). A monitor 191 or other type of display device is also connected to the system bus 121 via an interface, such as a video interface 190. In addition to the monitor, computers may also include other peripheral output devices such as speakers 197 and printer 196, which may be connected through a output peripheral interface 190.

The computer 110 may operate in a networked environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 5. The logical connections depicted in FIG. 5 include a local area network (LAN) 171 and a wide area network (WAN) 173, but may also include other networks. Such networking environments are commonplace in offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 5 illustrates remote application programs 185 as residing on memory device 181. It will be appreciated that the network connections shown are exemplary and other means of establishing a communications link between the computers may be used.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

I claim:

1. A method of encoding a data file, comprising the steps of:

assigning a context to the data file;

encoding the data file using an encoding method associated with the context by applying an XSLT defined in the data file to the data file and wherein applying the XSLT file substitutes existing tags in the data file with shorter tags.

2. The method of claim 1 wherein the step of assigning a context includes defining a set of transformation rules for the data file.

3. The method of claim 2 where the transformation rules are expressed in an XSLT style sheet.

4. The method of claim 1 wherein the data file is an XML file.

5. The method of claim 4 wherein the XML file is an instance document of CSTA.

6. The method of claim 1 wherein the steps of assigning and encoding are repeated for a plurality of data files, and wherein the step of assigning includes assigning a first context to at least a first data file and a second context to at least a second data file.

7. The method of claim 6 wherein the step of assigning includes assigning one context to each of said plurality of data files.

8. The method of claim 6 wherein the step of assigning includes assigning a context based on groups of said plurality of files segmented according to an XML schema.

9. The method of claim 8 wherein the context is chosen based on the element names defined in the XML schema.

10. The method of claim 8 wherein the context is transmitted along with the encoded data.

11. The method of claim 8 wherein the XML schema is CSTA XML.

12. A method of decoding a data file, comprising the steps of reading a context assigned to a data file; and decoding the data file using a decoding method associated with the context;

wherein the steps of reading and decoding are repeated for a plurality of data files, and wherein the step of reading includes reading a first context from at least a first data file and a second context from at least a second data file.

13. The method of claim 12 wherein the step of reading includes reading an XSLT file definition.

14. The method of claim 13 wherein the data file is an XML file and the step of decoding comprises applying an XSLT file defined in the data file.

15. A computer implemented method of communicating data between a first computer and a second computer, comprising:

encoding a data file with a context-sensitive encoding technique;

transferring the data between the first computer and the second computer; and decoding the data file with a context sensitive decoding technique;

wherein the step of encoding is performed for a plurality of data files and includes encoding at least a first data file based on a first context-sensitive encoding technique and encoding a second data file based on a second context-sensitive encoding technique.

16. The method of claim 15 wherein the step of decoding is performed for said first data file based on a first context-sensitive decoding technique and said second data file based on a second context-sensitive encoding technique.

* * * * *